United States Patent [19]

Uriu et al.

[11] Patent Number: 5,647,966

[45] Date of Patent: Jul. 15, 1997

[54] METHOD FOR PRODUCING A CONDUCTIVE PATTERN AND METHOD FOR PRODUCING A GREENSHEET LAMINATION BODY INCLUDING THE SAME

[75] Inventors: Eiichi Uriu, Neyagawa; Osamu Makino, Hirakata; Hironobu Chiba, Itami; Chisa Yokota, Osaka, all of Japan

[73] Assignee: Matsushita Electric Industrial Co., Ltd., Kadoma, Japan

[21] Appl. No.: 537,512

[22] Filed: Oct. 2, 1995

[30] Foreign Application Priority Data

Oct. 4, 1994 [JP] Japan .................. 6-240083

[51] Int. Cl.$^6$ .................. H05K 3/70; C25D 1/00
[52] U.S. Cl. .................. 205/78; 205/67; 156/89; 156/150
[58] Field of Search .................. 205/67, 78; 156/235, 156/237, 233, 89, 150

[56] References Cited

U.S. PATENT DOCUMENTS

| | | | |
|---|---|---|---|
| 3,247,573 | 4/1966 | Noack | 29/155.5 |
| 3,414,487 | 12/1968 | Helms et al. | 204/11 |
| 3,798,059 | 3/1974 | Astle et al. | 117/212 |
| 4,586,976 | 5/1986 | Takano et al. | 156/233 |
| 4,604,160 | 8/1986 | Murakami | 156/630 |
| 4,753,694 | 6/1988 | Herron | 156/89 |
| 5,063,658 | 11/1991 | Wild | 29/846 |
| 5,233,157 | 8/1993 | Scheiber et al. | 219/121.68 |
| 5,354,205 | 10/1994 | Feigenbaum | 439/67 |
| 5,358,604 | 10/1994 | Lin et al. | 156/664 |
| 5,470,412 | 11/1995 | Fukuta | 156/89 |
| 5,480,503 | 1/1996 | Casey | 156/89 |

FOREIGN PATENT DOCUMENTS

| | | |
|---|---|---|
| 633477 | 10/1963 | Belgium . |
| 0152634 | 8/1985 | European Pat. Off. . |
| 0185998 | 7/1986 | European Pat. Off. . |
| 0310396 | 4/1989 | European Pat. Off. . |
| 0413348 | 2/1991 | European Pat. Off. . |
| 0533198 | 3/1993 | European Pat. Off. . |
| 1279797 | 10/1968 | Germany . |
| 58-012315 | 1/1983 | Japan . |
| 59-145009 | 9/1984 | Japan . |
| 60-167306 | 8/1985 | Japan . |
| 60-176208 | 9/1985 | Japan . |
| 61-140115 | 6/1986 | Japan . |
| 61-295617 | 12/1986 | Japan . |
| 63-284886 | 11/1988 | Japan . |
| 64-002394 | 1/1989 | Japan . |
| 64-42809 | 2/1989 | Japan . |
| 2228093 | 9/1990 | Japan . |
| 3219605 | 9/1991 | Japan . |
| 493006 | 3/1992 | Japan . |
| 4314876 | 11/1992 | Japan . |
| 6089811 | 3/1994 | Japan . |
| 7-57961 | 3/1995 | Japan . |
| 775909 | 8/1995 | Japan . |
| 8900373 | 1/1989 | WIPO . |

OTHER PUBLICATIONS

Search Report for European Appl. 95115632.2, mailed Jan. 24, 1996.

"Metallization Process for Green Ceramic Sheets," *Tech. Discl. Bulletin*, vol. 36, No. 1, Jan. 1993 IBM.

News aus der Technik, No. 2, Jul. 10, 1990, Wurzburg DE, Bestucken einer Schaltungsplatte mit IC.

Search Report for European Appl. 95114233.0, mailed Jan. 26, 1996.

*Primary Examiner*—John Niebling
*Assistant Examiner*—Brendan Mee
*Attorney, Agent, or Firm*—Renner, Otto, Boisselle & Sklar

[57] ABSTRACT

A method for producing a conductive pattern includes the steps of forming a mask layer on a conductive base plate, the mask layer having a pattern defining an exposed area of the conductive base plate; forming a conductive pattern on the exposed area of the conductive base plate by electroforming using a plating liquid which substantially maintains the pattern of the mask layer; and transferring the conductive pattern onto a support layer without removing the mask layer.

21 Claims, 8 Drawing Sheets

METHOD FOR PRODUCING A CONDUCTIVE PATTERN AND METHOD FOR PRODUCING A GREENSHEET LAMINATION BODY INCLUDING THE SAME

BACKGROUND OF THE INVENTION

1. Field of the Invention

The present invention relates to a method for producing a conductive pattern and a method for producing a greensheet lamination body including the same, both of which are used for an electronic component such as a lamination chip inductor.

2. Description of the Related Art

Recently, electronic components have been significantly reduced in size, and thus lamination chip inductors which are smaller and have a higher impedance have been demanded. Production of such a lamination chip inductor requires conductive patterns formed therein to be finer and thinner and to have a higher density.

Development of compact electronic devices having a high level of performance such as cellular phones requires a chip-type LCR module having various functions. Production of such an LCR module also requires efficient formation of fine conductive patterns having a sufficient density.

Such conductive patterns are generally produced by conventional printing. In order to form finer patterns, various methods have been attempted including offset printing, enlargement of the aperture ratio of the screen in screen printing, use of a conductive powder having a smaller diameter, and improvement in the vehicle used for preparing the powder. By such methods, the width of the conductive patterns cannot be reduced to less than 50 to 80 μm for practical use. Further, the conductive patterns tend to have less thickness as the width is reduced, which increases the resistance thereof.

As a solution to the above-described problems, Japanese Laid-Open Patent Publication No. 4-314876 discloses a method for forming a conductive pattern using transfer. In this method, a releasable thin metal layer formed by evaporation is treated with wet plating to obtain a desirable metal layer, and an extra area of the resultant metal layer is removed by etching as necessary to obtain a desired pattern. The resultant pattern is transferred onto a support layer. By such a method, a relatively thin metal conductive pattern (having a thickness of, for example, 10 μm or less) can be formed to be used as an internal electrode for a lamination ceramic capacitor or the like.

However, production of a fine conductive pattern becomes more difficult as the thickness of the metal layer increases (for example, to more than 10 μm) by this method.

Further, since the desired pattern is obtained under a mask layer used for etching, the mask layer needs to be removed before the transfer. When the mask layer is removed, the conductive pattern may also be undesirably removed. Such a phenomenon becomes more prevalent as the thickness of the metal layer increases. The reason is that, as the thickness of the metal layer increases, etching takes a longer period of time and thus the thin metal film is exposed to the etchant at a higher degree.

Moreover, the above-described method is not very efficient because a mask layer for etching needs to be formed on the metal layer for formation of each conductive pattern.

SUMMARY OF THE INVENTION

In one aspect of the present invention, the method for producing a conductive pattern according to the present invention includes the steps of: forming a mask layer on a conductive base plate, the mask layer having a pattern defining an exposed area of the conductive base plate; forming a conductive pattern on the exposed area of the conductive base plate by electroforming using a plating liquid which substantially maintains the shape of the mask layer; and transferring the conductive pattern onto a support layer without removing the mask layer. By "a plating liquid which substantially maintains the pattern of the mask layer", we mean a plating liquid which substantially does not change the pattern of the mask layer by dissolving, swelling or the like. In other words, the material of the mask layer is resistant against a plating liquid.

In one embodiment of the present invention, the method further includes the step of forming a groove in the exposed area of the conductive base plate by etching before the formation of the conductive pattern.

In another embodiment of the present invention, the step of forming a conductive pattern further includes the step of forming a conductive release layer on the exposed area of the conductive base plate, and the conductive pattern is formed on the conductive release layer.

In still another embodiment of the present invention, the conductive release layer and the conductive pattern are formed of identical materials.

In still another embodiment of the present invention, the step of forming the mask layer includes the steps of: forming a photoresist on the conductive base plate; and irradiating the photoresist with light for development to form the mask layer of the photoresist.

In still another embodiment of the present invention, the step of forming the mask layer includes the steps of: forming a photoresist on the conductive base plate; irradiating the photoresist with light for development to form an exposed area on the conductive base plate; forming an insulation layer on the exposed area; and removing the photoresist to form the mask layer of the insulation layer.

In still another embodiment of the present invention, the step of forming the mask layer includes the steps of: forming an insulation layer on the conductive base plate; and irradiating the photoresist with an excimer laser to form the mask layer of the insulation layer.

In still another embodiment of the present invention, the mask layer is releasable from the support layer.

In still another embodiment of the present invention, the method further includes the step of forming a releasable layer on the mask layer prior to the transferring step, wherein the releasable layer is releasable from the support layer.

In still another embodiment of the present invention, the step of forming the conductive body includes the step of forming the conductive body projecting from the mask layer.

In still another embodiment of the present invention, in the step of forming the conductive body, a plating liquid having a pH of about 1 to about 7 and not including cyanide is used.

In another aspect of the present invention, the method for producing a greensheet lamination body according to the present invention includes the steps of: forming a mask layer on a conductive base plate, the mask layer having a pattern defining an exposed area of the conductive base plate; forming a conductive pattern on the exposed area of the conductive base plate by electroforming using a plating liquid which substantially maintains the shape of the mask layer; transferring the conductive pattern onto a first insulation greensheet without removing the mask layer; and forming a second insulation greensheet on a surface of the first insulation greensheet having the conductive pattern transferred thereon.

In one embodiment of the present invention, the step of the forming the conductive pattern includes the step of directly transferring the conductive pattern onto the first insulation greensheet without removing the mask layer.

In another embodiment of the present invention, the step of the forming the conductive pattern includes the steps of: directly transferring the conductive pattern onto a thermally releasable adhesive sheet without removing the mask layer; and transferring the conductive pattern on the thermally releasable adhesive sheet onto the first insulation greensheet.

In still another embodiment of the present invention, the step of the forming the conductive pattern includes the steps of: forming an insulation paste so as to cover the mask layer and the conductive pattern and drying the insulation paste to form the first insulation greensheet; and transferring the conductive pattern onto the first insulation greensheet without removing the mask layer.

In still another embodiment of the present invention, the method further includes the steps of: forming a plurality of first insulation greensheets each having the conductive pattern; and laminating the first insulation greensheets while electrically connecting the conductive patterns.

In still another embodiment of the present invention, the method further includes the step of interposing a third insulation greensheet having a through-hole between adjacent first insulation greensheets.

In still another embodiment of the present invention, the method further includes the step of interposing a third insulation greensheet having a through-hole filled with a printed thick film conductor between adjacent first insulation greensheets.

In still another embodiment of the present invention, the method further includes the step of interposing a third insulation greensheet having a through-hole filled with an electroformed conductor between adjacent first insulation greensheets.

In still another embodiment of the present invention, the method further includes the steps of: directly transferring the conductive pattern onto the first insulation greensheet without removing the mask layer; laminating a third insulation greensheet on a surface of the first insulation greensheet, the surface having the conductive pattern transferred thereon; directly transferring another conductive pattern onto the third insulation greensheet without removing the mask layer; and laminating a second insulation greensheet on a surface of the third insulation greensheet, the surface having the another conductive pattern transferred thereon.

In still another embodiment of the present invention, the first insulation greensheet and the second insulation greensheet are formed of a magnetic material.

Thus, the invention described herein makes possible the advantages of (1) providing a method for producing a fine conductive pattern even though the metal layer is relatively thick and a method for producing a greensheet lamination body having such a fine conductive pattern, and (2) a method for producing a conductive pattern which allows a mask layer to be used repeatedly.

These and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described by way of illustrative examples with reference to the accompanying drawings.

EXAMPLE 1

Figure 1:
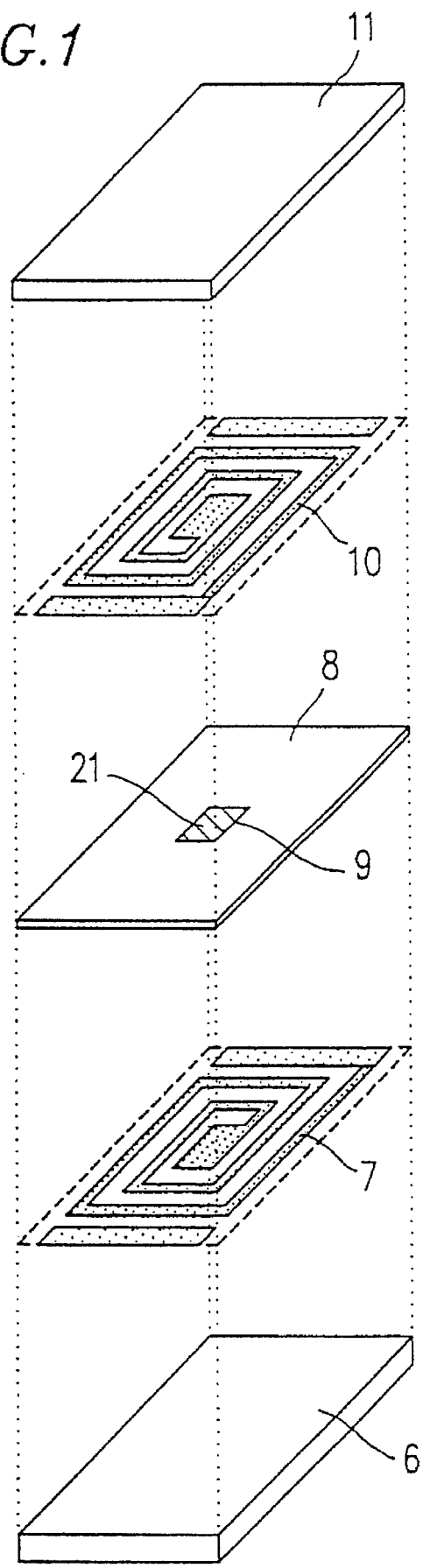
FIG. 1 is an exploded isometric view of a lamination ceramic chip inductor in a first example according to the present invention.
Figure 2:
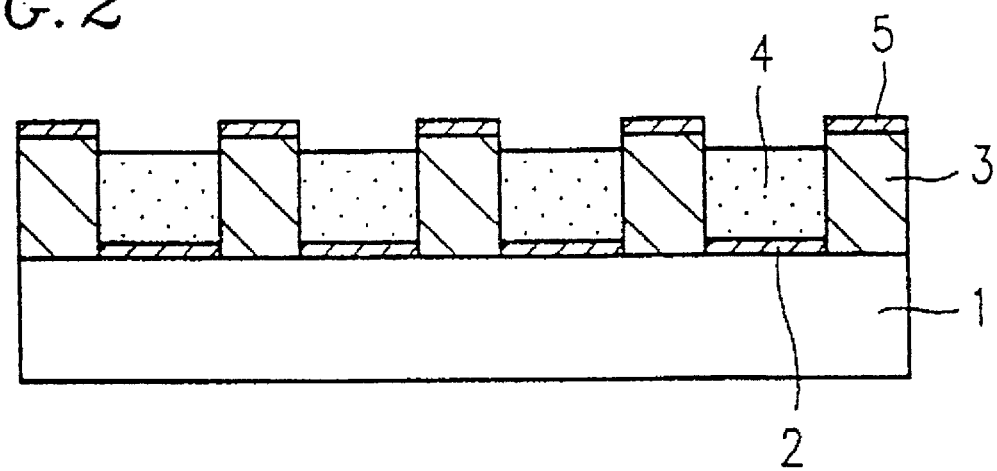
FIG. 2 is a cross sectional view illustrating a method for producing the lamination ceramic chip inductor shown in FIG. 1.
Figure 3:
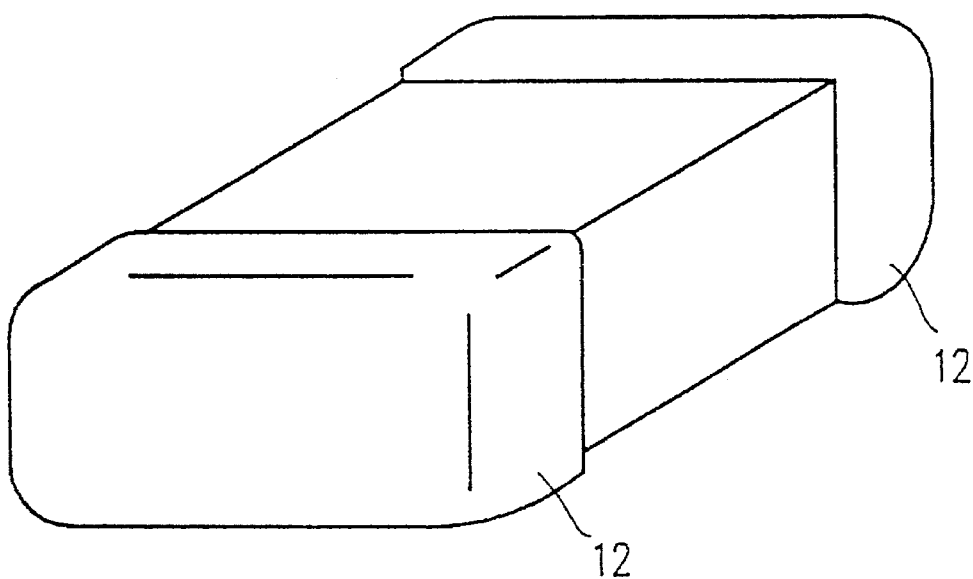
FIG. 3 is an isometric view of the lamination ceramic chip inductor produced in a method shown in FIG. 2.

A lamination ceramic chip inductor in a first example according to the present invention will be described with reference to FIGS. 1 through 3. FIG. 1 is an exploded isometric view of the lamination ceramic chip inductor (hereinafter, referred to simply as an "inductor") in the first example.

In all the accompanying figures, only one lamination body to be formed into one inductor is illustrated for simplicity. However, in actual production, a plurality of lamination bodies are formed on one plate and separated after the lamination bodies are completed.

The inductor shown in FIG. 1 includes a plurality of magnetic greensheets 6, 8 and 11, and a plurality of coil-shaped plated conductive patterns (hereinafter, referred to simply as "conductive patterns") 7 and 10.

The conductive patterns 7 and 10 are each formed by electroforming. The magnetic greensheets 6 and 11 respectively have the conductive patterns 7 and 10 transferred thereon. The conductive patterns 7 and 10 are connected to each other via a conductor 21 formed in a through-hole 9 formed in the magnetic greensheet 8.

Hereinafter, a method for producing the inductor in FIG. 1 will be described.

[Formation of the conductive patterns]

First, the formation of the conductive patterns 7 and 10 will be described with reference to FIG. 2.

A stainless steel base plate 1 is entirely coated with a mask layer 3. The mask layer 3 is formed of an acrylic dry film having resistance against both acid and alkali (for example, Dialon FRA-063 produced by Mitsubushi Rayon Kabushiki Kaisha). The mask layer 3 is dried at a temperature of approximately 160° C. for 60 minutes and thus adheres to the base plate 1. The mask layer 3 thus obtained has a thickness of approximately 45 µm.

Next, a release layer 5 is formed on the mask layer 3 by dip-coating the resultant lamination body with a liquid fluorine coupling agent (for example, perfluorodecyltriethoxysilane). The release layer 5 is then cured at a temperature of 200° C. The thickness of the release layer 5 after curing is approximately 0.1 µm or less. The formation of the release layer 5 can be omitted.

An area of the resultant lamination body on which a conductive pattern will be formed is irradiated by excimer laser light having a wavelength of 308 nm (output: 50 to 80 W) to expose the base plate 1 in a desirable pattern for the conductive pattern. The desirable pattern in this example is coiled and has a width of approximately 40 µm (corresponding to conductive patterns 7 and 10 in FIG. 1). The area which is not irradiated by the excimer laser light acts as a mask for forming a conductive pattern.

Due to the use of the excimer laser light, the mask layer 3 can be patterned clearly. Accordingly, a fine pattern having a relatively high resolution can be obtained, which is impossible when the mask layer is patterned by heat generated by a general YAG (yttrium aluminum garnet) laser or the like. The base plate 1 is not damaged in the wavelength range of the excimer laser light.

A probable reason that the excimer laser light can remove a part of a resin layer is that the energy of the excimer laser light having a wavelength of 308 nm or 248 nm has the chemical function of cutting a chain (for example, a carbonyl group of an acrylic resin). Thus, the mask layer may be formed of any material having a group, such as a carbonyl group, which is cleavable upon irradiation by an excimer laser.

The mask layer 3 formed in the above-described manner adheres to the base plate 1 with sufficient strength and thus is not delaminated. Accordingly, the base plate i having the mask layer 3 can be used repeatedly for forming more conductive patterns.

In the case where the conductive pattern 4 is held excessively tight between adjacent areas of the mask layer 3 to be transferred, various adhesive sheets can be used to pull out the conductive pattern 4.

By setting appropriate output conditions of the laser, a conductive pattern having a minimum width of approximately 10 µm and a thickness of approximately 50 µm can be formed.

In the case where a mask layer, formed of a photosensitive acrylic dry film, is patterned by photolithography, it is easy to form a pattern having a width of as small as 10 to 30 µm, but it is difficult to provide the pattern with a large thickness. When the width of the pattern is 10 µm, the thickness is approximately 10 µm at the maximum.

After the formation of the mask layer 3, strike plating (high speed plating) is performed to form a conductive release layer 2 having a thickness of about 0.1 µm or less on the exposed area of the base plate 1. Strike plating is performed by immersing the resultant lamination body in an alkaline AgCN bath, which is generally used. An exemplary composition of an alkaline AgCN bath is shown in Table 1.

TABLE 1

| | |
|---|---|
| AgCN | 3.8 to 4.6 g/l |
| KCN | 75 to 90 g/l |
| Liquid temperature | 20 to 30° C. |
| Current density | 1.6 to 3.0 A/dm$^2$ |

When the bath shown in Table 1 is used, a conductive release layer having a thickness of approximately 0.1 µm is formed after approximately 5 to 20 seconds.

Although we do not wish to be bound by any theory, one probable reason that the conductive release layer 2 has releasability is: since an Ag layer is formed by high-speed plating (strike plating) on the stainless steel base plate 1 having a low level of adherence with Ag, the resultant Ag layer (the conductive release layer 2) becomes highly strained and thus cannot sufficiently adhere to the base plate 1.

The conductive release layer 2 can also be formed by using a silver mirror reaction.

The base plate 1 can be formed of an electrically conductive material instead of stainless steel and processed to have releasability. Exemplary materials which can be used for the base plate 1 and the respective methods for providing the base plate 1 with releasability are shown in Table 2.

TABLE 2

| Usable material | Method for providing releasability |
|---|---|
| Iron-nickel-type metal | Anodizing with NaOH (10%) to form an excessively thin oxide film. |
| Copper-nickel-type metal | Immersing in potassium bichromate to form a chromate film. |
| Aluminum | Immersing in a zinc substitution liquid to form a zincate. |
| Copper, brass | Immersing a 0.5% solution of selenium dioxide |

Instead of metal or metal alloys, the base plate 1 can be formed of a polyethyleneterephthalate (hereinafter, referred to as "PET") film or the like provided with conductivity. The same effects are obtained as by metal, but a metal plate is more efficient since it is not necessary to provide a metal plate with conductivity.

Especially, stainless steel is chemically stable and has satisfactory releasability due to a chrome oxide film existing on a surface thereof. Thus, stainless steel is the most preferable to use from among the usable materials.

After the conductive release layer 2 is formed, the lamination body is immersed in an Ag electroplating bath to form an Ag conductive pattern 4 (corresponding to the conductive patterns 7 and 10 in FIG. 1) having a necessary thickness t. In this example, the Ag conductive pattern 4 has a thickness t of approximately 40 to 45 µm.

In order to form the conductive patterns 7 and 10 having a resolution (namely, shape and size) corresponding to that of the mask layer 3, the conductive pattern 4 is formed to have a thickness which is equal to or less than the thickness of the mask layer 3. The thickness of the conductive pattern 4 is preferably less than the thickness of mask layer 3 by approximately 5 µm. In the case where the Ag conductive pattern 4 is thicker than the mask layer 3, the Ag conductive pattern 4 extends laterally to partially cover the mask layer 3. In such a state, the resolution of the mask layer 3 cannot be reflected to the conductive pattern 4 sufficiently. In the case where the thickness of the Ag conductive pattern 4 is less than the thickness of the mask layer 3 by more than about 5 µm, the Ag conductive pattern 4 cannot be transferred onto the metal sheet.

Figure 9:
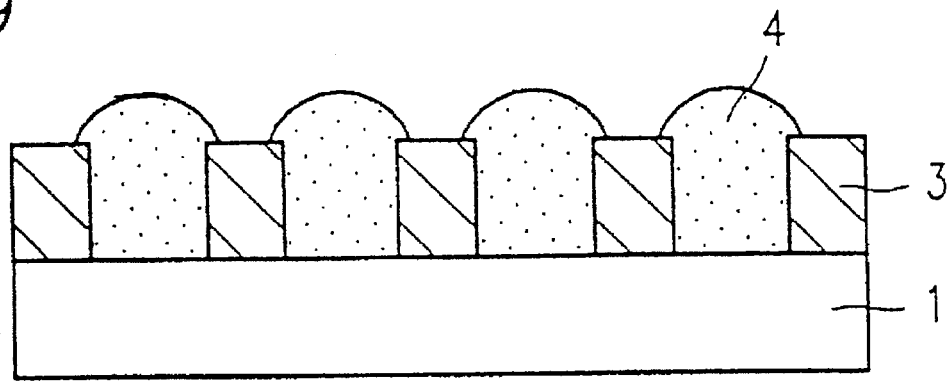
FIG. 9 is a cross sectional view illustrating a modification of the method for producing the lamination ceramic chip inductor in the first example.

In the case where the resolution of the mask layer 3 need not be reflected to the conductive pattern 4, the conductive pattern 4 can be thicker than the mask layer 3 as is shown in FIG. 9. Since a part of the Ag conductive pattern 4 projecting from the mask layer 3 is buried into the greensheet when the Ag conductive pattern 4 is pressed onto the greensheet, the Ag conductive pattern 4 can be transferred onto the greensheet (acting as a support layer) with sufficient strength. Further, since the cross sectional area of the conductive pattern 4 is enlarged, the resistance of the conductive pattern 4 is reduced. It is necessary to make an adjustment so that a shortcircuit does not occur between adjacent areas of the conductive pattern 4 because the conductive pattern 4 extends isometrically on the mask layer 3.

In this example, the mask layer 3 is resistant against both acid and alkali. Accordingly, a plating bath having any composition can be used for forming the conductive pattern. Depending on the kind of the mask layer, it is necessary to select a plating bath which does not remove the mask layer.

In this example, an Ag plating bath which is weakly alkaline or neutral is used, especially for the purpose of extending the life of the mask layer 3. An exemplary composition of a weak alkaline or neutral Ag plating bath is shown in Table 3.

TABLE 3

| | |
|---|---|
| KAg(CN)$_2$ | 30 g/l |
| KSCN | 330 g/l |
| Potassium citrate | 5 g/l |
| pH | 7.0 to 7.5 |
| Liquid temperature | Room temperature |
| Current density | 2.0 A/dm$^2$ or less |

In this example, the current density is approximately 1 A/dm$^2$. The current density is set to be such a value because an excessively high current density required for accelerating the plating speed causes strain of the Ag conductive pattern 4, thus possibly removing the Ag conductive pattern 4 before transferred.

The Ag conductive pattern 4 having a thickness of approximately 40 μm is obtained after immersing the lamination body in the plating bath for approximately 160 minutes. Such a period of time is excessively short for mass-producing an identical conductive pattern.

In this example, the release layer 2 is formed by strike-plating the base plate 1 in an alkali Ag bath. Alternatively, the base plate 1 can be immersed in a weak alkaline or neutral bath. In this case, a sufficiently high current density is used for the first several minutes in order to strain the Ag conductive pattern 4 sufficiently to provide an area of the Ag conductive pattern 4 in the vicinity of the surface of the stainless steel base plate 1 with releasability. Accordingly, it is not necessary to form the release layer 2.

An exemplary composition of an acid Ag plating bath is shown in Table 4.

TABLE 4

| | |
|---|---|
| AgCl | 12 g/l |
| Na$_2$S$_2$O$_3$ | 36 g/l |
| NaHSO$_3$ | 4.5 g/l |
| NaSO$_4$ | 11 g/l |
| pH | 5.0 to 6.0 |
| Liquid temperature | 20 to 30° C. |
| Current density | 1.5 A/dm$^2$ or less |

The plating bath shown in Table 4 does not remove the mask layer 3 because of being acidic. When an acid Ag plating bath containing a surfactant (methylimidazolethiol, furfural, turkey-red oil, or the like) is used, the brilliance of the surface of the Ag conductive pattern 4 is improved.

[Formation of the magnetic greensheets]

Hereinafter, a method for forming the magnetic greensheets 6, 8 and 11 will be described.

A resin such as a butyral resin, an acrylic resin or ethylcellulose, end a plasticizer such as dibutylphthalate are dissolved in an alcohol having a high boiling point such as terpineol to obtain a vehicle. The vehicle and a Ni.Zn.Cu type ferrite powder having particles with an average diameter of approximately 0.5 to 2.0 μm are kneaded together to form a ferrite paste (slurry). A PET film is coated with the ferrite paste using a doctor blade and then dried at 80° to 100° C. until slight tackiness is left. Thus, the magnetic greensheets 6, 8 and 11 are obtained.

The magnetic greensheets 6 and 11 are each formed to have a thickness of approximately 0.3 to 0.4 mm, and the magnetic greensheet 8 is formed to have a thickness of approximately 20 to 100 μm. Then, the magnetic greensheet 8 is punched to form the rectangular throughhole 9 having a side which is approximately 0.15 to 0.3 mm long.

[Transfer of the conductive patterns]

Next, a method for transferring the conductive patterns 7 and 10 on the magnetic greensheets 6 and 11 and laminating the magnetic greensheets 6, 8 and 11 will be described.

The base plate 1 having the conductive pattern 7 (corresponding to the conductive pattern 4 in FIG. 2) is pressed on the magnetic greensheet 6 formed on the PET film. When necessary, pressure and heat can be provided. The conductive pattern 7 has appropriate releasability from the base plate 1, and the magnetic greensheet 6 has appropriate adhesion (tackiness). Thus, the conductive pattern 7 can be transferred on the magnetic greensheet 6 easily by peeling off the magnetic greensheet 6 from the base plate 1. The release layer 5 formed on the mask layer 3 further facilitates the peeling-off of the magnetic greensheet 6.

In the case where the mechanical strength of the magnetic greensheet 6 is insufficient, additional strength can be provided by forming a viscous sheet on the magnetic greensheet 6.

In the same manner, the conductive pattern 10 is transferred on the magnetic greensheet 11.

The magnetic greensheet 8 is located between the magnetic greensheet 6 having the conductive pattern 7 and the magnetic greensheet 11 having the conductive pattern 10. The magnetic greensheets 6, 8 and 11 are laminated so that the conductive patterns 7 and 10 are connected to each other via the through-hole 9 to form a conductor coil. The adherence between the magnetic greensheets 6, 8 and 11 of the resultant lamination body are strengthened by heat (60° to 120° C.) and pressure (20 to 500 kg/cm$^2$), and thus the lamination body is formed into an integral body.

Connecting the two conductive patterns 7 and 10 through a thick film conductor provides better ohmic electric connection. Accordingly, a printed thick film conductor 21 is preferably provided in the through-hole 9 of the magnetic greensheet 8 as is shown in FIG. 1.

Usually in the above-described process, a plurality of conductive patterns are formed on one magnetic greensheet, and the magnetic greensheets are laminated in the state of having the plurality of conductive patterns, in order to mass-produce inductors with higher efficiency. After the integral bodies are formed, the resultant greensheet lamination is cut into a plurality of integral bodies, and each integral body is sintered at a temperature of about 850° to 1,000° C. for approximately 1 to 2 hours. The cutting can also be performed after sintering.

An electrode of a silver alloy (for example, AgPd) is formed on each of two opposed side surfaces of each integral body and connected to the conductor coil. Then, the integral body is sintered at approximately 600° to 850° C. to form outer electrodes 12 shown in FIG. 3. When necessary, the outer electrodes 12 are plated with nickel, solder or the like.

In this manner, the inductor having an outer size of 1.6 mm×0.8 mm and a thickness of 0.8 mm is obtained. The conductor coil, which includes the two conductive patterns 7 and 10 each having 2.5 turns, has 5 turns in total. Accordingly, an impedance of approximately 600 Ω is obtained at a frequency of 100 MHz. The DC resistance can be as small as approximately 0.08 Ω because the thickness of the conductor coil is as much as approximately 40 μm.

The inductor was cut for examination. No specific gap was found at the interfaces between the conductor coil and the magnetic greensheets. Although we do not wish to be bound by any theory, one probable reason is that in contrast to a conductor coil formed of thick film conductive patterns which are produced by printing and requires the binder to be removed, the conductor coil produced by electroforming according to the present invention scarcely shrinks from sintering and thus is surrounded by the sintered magnetic body with a high density.

The material for the magnetic greensheets used in the present invention is not limited to the one used in this example. Although a magnetic greensheet is preferably used in order to obtain a high impedance, an insulation sheet having dielectricity can also be used.

In this example, an acrylic dry film is used for the mask layer 3. Alternatively, the mask layer 3 can be formed of a material having a high resistance against acid and alkali such as fluorine, a resin such as an acrylic resin, an epoxy resin, polyethylene, polyacetal, and a modified material thereof, or rubber. In order to enhance the hardness of the mask layer 3, various ceramic powders can be dispersed in the above-mentioned resins as a filler.

The mask layer 3 can be formed by, for example, spray-coating, roll-coating, dip-coating, electrostatic coating, printing, dry film lamination, or resin film bonding.

Alternatively, the mask layer 3 can be formed by treating an inorganic material such as ceramic, glass or metal with electroforming or flame spraying.

The mask layer 3 can be patterned by various methods including irradiation by light, use of a YAG laser or a CO$_2$ laser, or a mechanical method such as sand blasting, water jetting or cutting.

Although the electroplating (electroforming) is preferable in terms of speed of coating, general plating can also be used.

EXAMPLE 2

A method for producing a lamination ceramic chip inductor in a second example according to the present invention will be described with reference to FIGS. 4 through 8. The lamination ceramic chip inductor in the second example has the same structure as the inductor in the first example.

Figure 4:
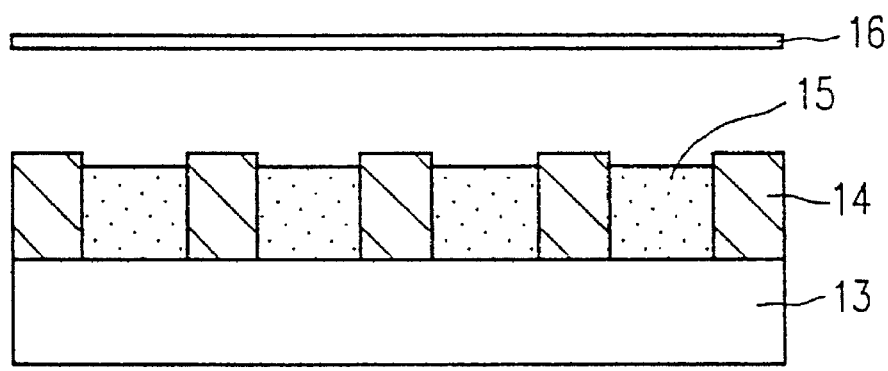
FIGS. 4 through 6 are cross sectional views illustrating a method for producing a lamination ceramic chip inductor in a second example according to the present invention.

First, a stainless steel base plate 13 is degreased and washed. Next, as is shown in FIG. 4, a mask pattern is formed in an area of a surface of the base plate 13 where a conductive pattern 15 is to be formed. Then, the base plate 13 is entirely coated with a fluoride resin resistant against both acid and alkali (Polyfron TC-7400 produced by Daikin Kogyo Kabushiki Kaisha) to form a mask layer 14. The resultant lamination body is pre-dried at a temperature of approximately 200° C. for 3 to 5 minutes to be cured, and then the mask pattern is removed to pattern the mask layer 14. The resultant lamination body is cured at a temperature of approximately 280° C. for 3 to 5 minutes. Thus, the mask layer 14 adheres to the base plate 13 sufficiently strongly. The base plate 13 is exposed in the area where the mask layer 14 is not formed. The mask layer 14 has a thickness of approximately 45 μm after cured. Since the fluoride resin has highly releasable, the release layer 5 formed in the first example is not necessary.

The conductive pattern 15 is formed in the same manner as in the first example; that is, by dipping the resultant lamination body in an alkali Ag plating bath. In the first example, the conductive release layer 2 is first formed using an Ag alkali plating bath by strike plating prior to the formation of the conductive pattern 15. In this example, the mask layer 14 is formed of a fluoride resin, which is especially resistant against alkali. Accordingly, an alkali Ag bath shown in Table 1 can also be used with current density being kept at a sufficiently high level for the first several minutes in order to strain the Ag film sufficiently to provide the interface between the Ag film and the surface of the stainless steel base plate 13 with releasability. Then, the current density is lowered to form the conductive pattern 15. In this manner, the formation of the release layer 2 can be eliminated.

Figure 5:
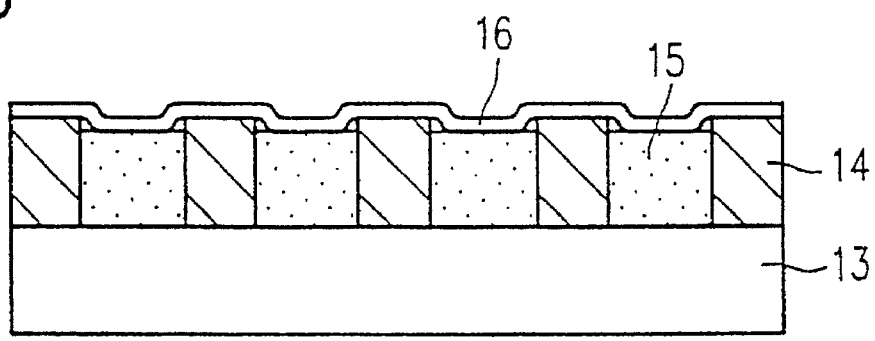

The conductive pattern 15 thus obtained has a thickness of about 43 μm. As is shown in FIG. 5, a thermally releasable adhesive foam sheet 16 including a foam layer (for example, Riba Alfa No. 3194M produced by Nitto Denko Kabushiki Kaisha) is attached to the lamination body by performing heating and foaming from above. The conductive pattern 15 adheres to the adhesive foam sheet 16 (a support layer) by applying heat of approximately 100° C. and a pressure of 20 kg/cm$^2$ for approximately 5 to 10 seconds.

The adhesive foam sheet 16 has a high level of adhesion and includes a relatively thick layer having tackiness. By applying a pressure to the adhesive sheet 16, the layer having tackiness is deformed to cause the conductive pattern 15 to adhere thereto. Thus, the transfer of the conductive pattern 15 is performed with certainty when the adhesive foam sheet 16 having the conductive pattern 15 is peeled off from the base plate 13 having the mask layer 14.

Figure 6:
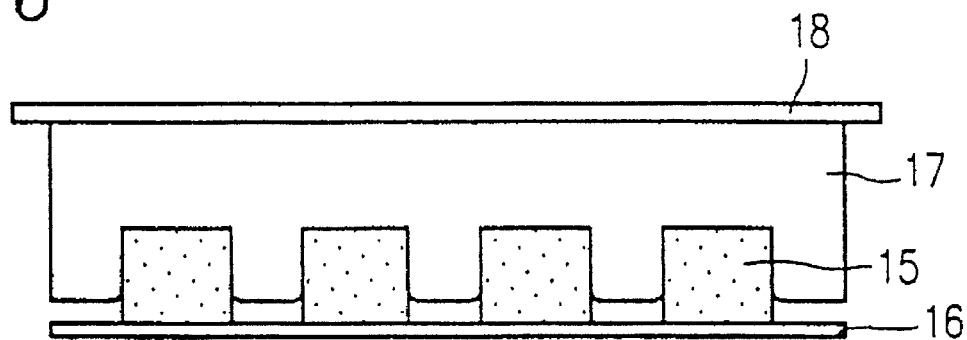

Then, as is shown in FIG. 6, a magnetic greensheet 17 formed on a PET film 18 is put on the conductive pattern 15 and applying a pressure (for example, 10 to 100 kg/cm$^2$) and heat (for example, 60° to 120° C.) for approximately 5 to 10 seconds to cause the conductive pattern 15 adhere to the magnetic greensheet 17.

Thereafter, the thermally releasable adhesive foam sheet 16 is heated at a temperature of approximately 120° to 150° C. to foam the foam layer thereof. Thus, the magnetic greensheet 17 having the conductive pattern 15 transferred thereon is obtained.

Alternatively, the transfer can also be performed in the following manner.

The conductive pattern 15 is obtained in the above-described manner as is shown in FIG. 4. Then, as is shown in FIG. 7, a paste for forming a magnetic greensheet is formed on the conductive pattern 15 and the mask layer 14 to an appropriate thickness (for example, 50 to 100 μm) by screen printing and dried to obtain a printed magnetic greensheet 19.

Figure 8:
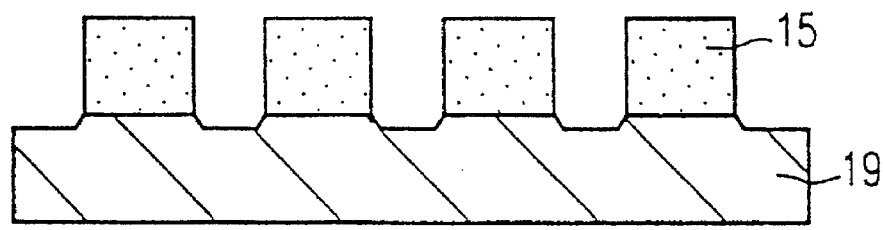

In the case where the printed magnetic greensheet 19 is formed of a paste containing a resin, for example, a butyral resin in a slightly larger amount than usual to have a higher mechanical strength, the printed magnetic greensheet 19 and the conductive pattern 15 can be peeled off together relatively easily from the base plate 13 and the mask layer 14 (FIG. 8).

Figure 7:
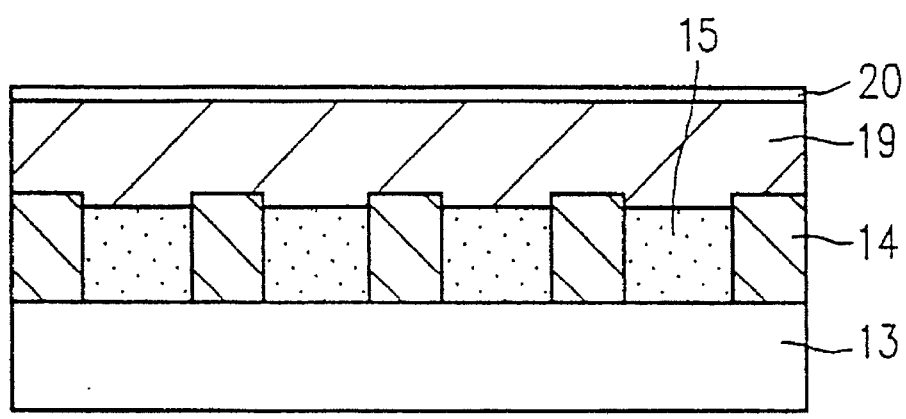
FIGS. 7 and 8 are cross sectional views illustrating modifications of the method for producing a lamination ceramic chip inductor in the second example according to the present invention.

Still alternatively, as is also shown in FIG. 7, a thermally releasable adhesive sheet 20 (made of, for example, Riba Alfa No. 3194M produced by Nitto Denko Kabushiki Kaisha) is bonded on the printed magnetic greensheet 19 (if necessary, by applying a pressure and heat) to integrate the adhesive sheet 20, the printed magnetic greensheet 19 and the conductive pattern 15. The integrated layers 20, 19 and 15 are peeled off from the base plate 13 and the mask layer 14. The integrated layers 20, 19 and 15 are again heated to foam the adhesive sheet 20. Thus, the adhesive sheet 20 is released, and as a result, the magnetic greensheet 19 having the conductive pattern 15 transferred thereon is obtained (FIG. 8).

In such a method, the conductive pattern 15 is buried into the magnetic greensheet 19 having tackiness. Accordingly, even if the mask layer 14 is significantly thinner than the conductive pattern 15 (for example, by about 5 μm), the releasability of the conductive pattern 15 from the base plate 13 is enhanced.

EXAMPLE 3

Figure 10:
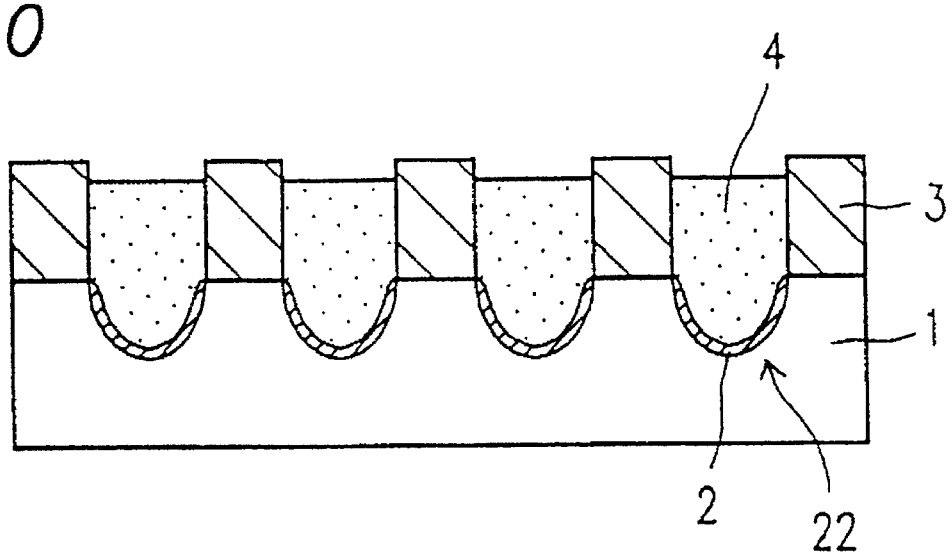
FIG. 10 is a cross sectional view illustrating a method for producing a conductive-pattern in a third example according to the present invention.

With reference to FIG. 10, a method for forming a conductive pattern which is thicker than the mask layer but has the same resolution (size and shape) of the mask layer will be described.

A mask layer 3 is formed on a stainless steel base plate 1 in the same manner as in the first example.

Next, an exposed area of the base plate 1 which is not covered with the mask layer 3 is etched to form a groove 22 in the base plate 1. For example, the groove 22 has a depth of approximately 20 μm as a result of performing etching at approximately 40° C. for several minutes using an aqueous solution of iron chloride (having a concentration of 30 to 40%) as an etchant. Since iron chloride does not cause damage to a material other than iron, any of the materials described in the first example can be used for the mask layer 3.

In the case where the groove 22 is excessively deep, the width of the groove 22 extends laterally to an area below the exposed surface of the base plate 1. In such a case, a conductive pattern 4 to be formed in the groove 22 cannot be transferred. Accordingly, the depth of the groove 22 is preferably set to be approximately 20 μm or less.

The resultant lamination body is heated to form an oxide film on the bottom of the groove 22. The oxide film has an appropriate level of releasability from the conductive pattern 4 which is to be formed. A release layer 2 can be formed by strike plating in addition to the oxide film. The oxide film and the release layer 2 enhance the releasability of the conductive pattern 4, which improves the yield at the transfer step. The oxide film and the release layer 2 can be eliminated.

Thereafter, as in the first example, the conductive pattern 4 is formed in the groove 22 by electroforming and is transferred onto a support layer such as a magnetic greensheet.

In the case where the mask layer 3 has a thickness of approximately 40 μm and the groove 22 has a depth of approximately 15 μm, the conductive pattern 4 having a thickness of 50 to 55 μm can be formed.

EXAMPLE 4

With reference to FIGS. 11A through 11H, a method for producing a conductive pattern thicker than the mask layer and a method for producing a greensheet lamination body including such a conductive pattern will be described.

Figure 11A:
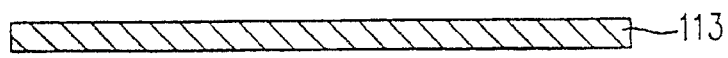
FIGS. 11A through 11H are cross sectional views illustrating a method for producing a conductive pattern and a greensheet lamination body in a fourth example according to the present invention.

As a conductive base plate, a stainless steel base plate 113 is used as is shown in FIG. 11A. The base plate 113 is degreased with an alkaline washing agent, rinsed and dried. The base plate 113 used in this example is formed of a flexible stainless steel plate having a thickness of approximately 0.1 mm (for example, SUS430).

Figure 11B:

As is shown in FIG. 11B, the base plate 113 is spin-coated with a liquid photoresist and dried to form a mask layer 114 having a thickness of approximately 5 μm. The thickness of the mask layer 114 is preferably 2 to 10 μm in order to utilize the easiness of patterning of the liquid photoresist. The mask layer 114 can also be formed by roll-coating or screen printing. As the liquid photoresist, a positive-type photoresist OFPR800 (produced by Tokyo Ohka Kabushiki Kaisha) is used, for example.

Figure 11C:
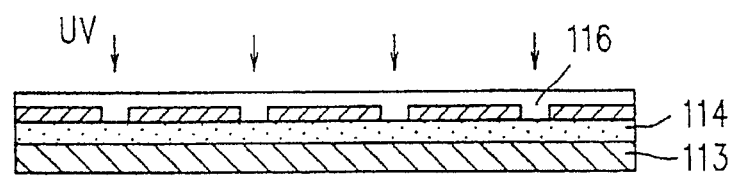
Figure 11D:
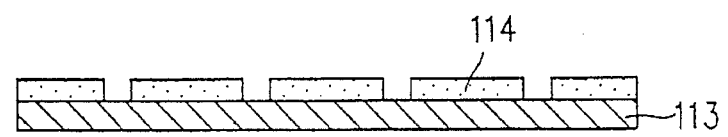

As is shown in FIG. 11C, a photomask 116 of chrome or the like is formed on the mask layer 114, and the resultant lamination body is irradiated with collimated UV rays. Then, development is performed using an alkaline development liquid (for example, an aqueous solution of sodium carbonate). The resultant lamination body is post-baked at approximately 150° C. for approximately 30 minutes. Thus, the mask layer 114 is formed into a prescribed pattern as is shown in FIG. 11D.

Then, the resultant lamination body is treated with Ag plating (Ag electroforming). Prior to the plating, the exposed surface of the base plate 113 can be activated if necessary. The activation is performed by immersing the lamination body in a 5% aqueous solution of sulfuric acid of 40° C. for 30 seconds.

Figure 11E:
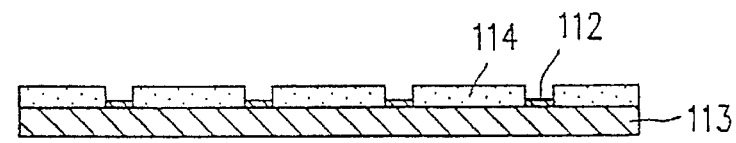
Figure 11F:
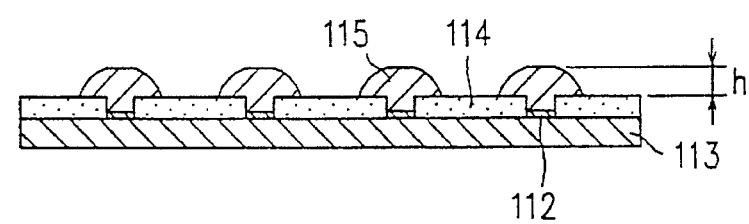

As is shown in FIG. 11E, a release layer 112 (made of strike-plated Ag) is formed on the exposed surface of the base plate 113 by performing strike plating with Ag at a current density of 0.3 A/dm$^2$ for several minutes. As the plating liquid, an acid Ag plating liquid containing no cyanide (for example, Dain Silver Bright PL-50 produced by Daiwa Kasei Kabushiki Kaisha) is used. The resultant release layer 112 has a thickness of about 0.1 to 1 μm. The resultant lamination body is further treated by plating with Ag to form a conductive pattern 115 having a thickness of about 20 to 25 μm as is shown in FIG. 11F. In the case where the plating is performed using an Ag plating liquid containing no cyanide (for example, Dain Silver AGPL30 produced by Daiwa Kasei Kabushiki Kaisha) at a pH of approximately 1.0 (acid) at a liquid temperature of approximately 40° C. and a current density of approximately 1 to 2 A/dm$^2$ for approximately 50 minutes, the resultant conductive pattern 115 has a thickness of approximately 20 μm. The pH of the plating liquid is preferably 1 to 7, and more preferably 1 to 4. Further, since no cyanide is contained, the plating liquid has no toxicity, and thus provides safety and simplifies the disposal process of the waste fluid. As a result, improvement in the operation efficiency and reduction in production cost are achieved.

A part of the conductive pattern 115 which projects from the mask layer 114 vertically also extends laterally. Accordingly, the line width of the conductive pattern 115 is larger than the width of the exposed surface of the base plate 113 which is defined by the mask layer 114. Where the conductive pattern 115 projects from the mask layer 114 vertically by height h, the conductive pattern 115 also extends laterally in one direction by approximately the same distance as height h. It is necessary to set an optimum width of the mask layer 114 and an optimum width of the gap between adjacent areas of the mask layer 114 when designing the conductive pattern 115. In FIG. 11F, the height h is 20 μm, the width of the gap between adjacent areas of the mask pattern 114 is 20 μm, the width of the mask pattern 114 is 60 μm, and the width of the conductive pattern 115 is 20 μm. Accordingly, the width of the area of the mask layer 114 which is not covered with the conductive pattern 115 is 20 μm.

The obtained conductive pattern 115 is transferred onto an insulation greensheet in the following manner. In this example, a magnetic greensheet 111 having a thickness of approximately 100 μm formed in the following manner is used as an insulation greensheet.

A resin such as a butyral resin, an acrylic resin or ethylcellulose, and a plasticizer such as dibutylphthalate are dissolved in a solvent having a low boiling point such as toluene, xylene or ethyl acetate to obtain a vehicle. The vehicle and a Ni.Zn.Cu type ferrite powder having particles with an average diameter of approximately 0.5 to 2.0 μm are kneaded together to form a ferrite paste (slurry). A PET film is coated with the ferrite paste using a doctor blade and then dried at 80° to 100° C. to obtain a magnetic greensheet 111.

Figure 11G:
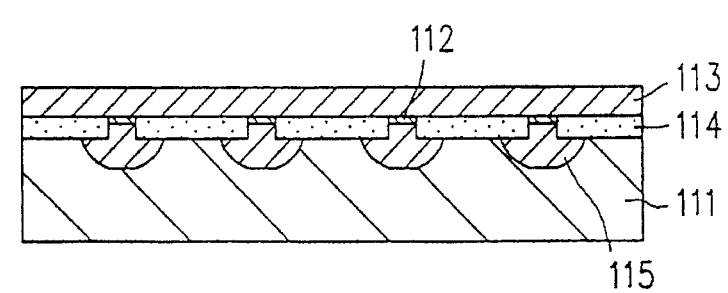

As is shown in FIG. 11G, the base plate 113 having the mask layer 114 and the conductive pattern 115 is put on the magnetic greensheet 111. Heat of 90° C. and a pressure of 80 kg/cm$^2$ are applied for 5 seconds. The part of the conductive pattern 115 projecting from the mask layer 114 is buried in the magnetic greensheet 111.

Figure 11H:
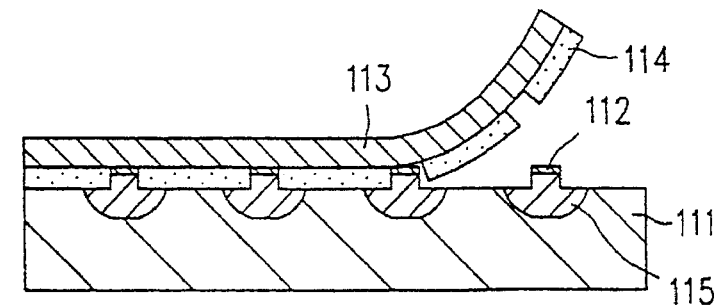

As is shown in FIG. 11H, the base plate 113 and the mask layer 114 are peeled off together from the magnetic greensheet 111 to transfer the conductive pattern 115 and the release layer 112 on the magnetic greensheet 111. The stainless steel base plate 113 is deformed as is shown in FIG. 11H due to the flexibility thereof and thus is easily peeled off.

The base plate 113 having the mask layer 114 is used for formation of another conductive pattern 115 in the same manner as is shown in FIGS. 11E through 11H.

In the above example, the conductive pattern 115 is directly transferred onto the insulation greensheet. Alternatively, the conductive pattern 115 can be first transferred onto a thermally releasable sheet and then transferred onto an insulation greensheet.

In this example, a relatively thick conductive pattern (over about 10 μm) can be formed using a relatively thin mask layer (2 to 10 μm). Accordingly, a mask layer having a high resolution pattern can be easily formed of a photoresist, and further a thick conductive pattern having a sufficiently low resistance can be formed. Since the conductive pattern in this example projects from the mask layer and thus is buried in the insulation greensheet, the transfer is performed satisfactorily.

With reference to FIGS. 12A through 12E, a method for producing a greensheet lamination body including a plurality of the above produced conductive patterns will be described.

Figure 12A:
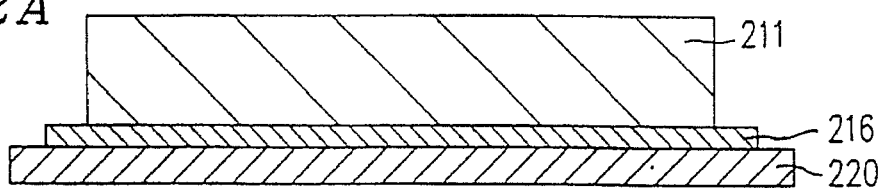
FIGS. 12A through 12E are cross sectional views illustrating a modification of the method for producing a greensheet lamination body in the fourth example.

As is shown in FIG. 12A, a foam sheet 216 which is thermally foamed (for example, Riba Alfa No. 3194M produced by Nitto Denko Kabushiki Kaisha) is formed on a stainless steel base plate 220. Next, on the foam sheet 216, a lamination body 211 including four magnetic greensheets each having a thickness of about 100 μm and formed in the manner described in the first example laminated sequentially is formed. The four magnetic greensheets can be laminated before being placed on the foam sheet 216 or can be laminated on the foam sheet 216 one after another. The thickness of the lamination body 211 can be changed in accordance with the desired end usage. The thickness of each magnetic greensheet can be changed, or the number of magnetic greensheets to be laminated can be changed.

Figure 12B:
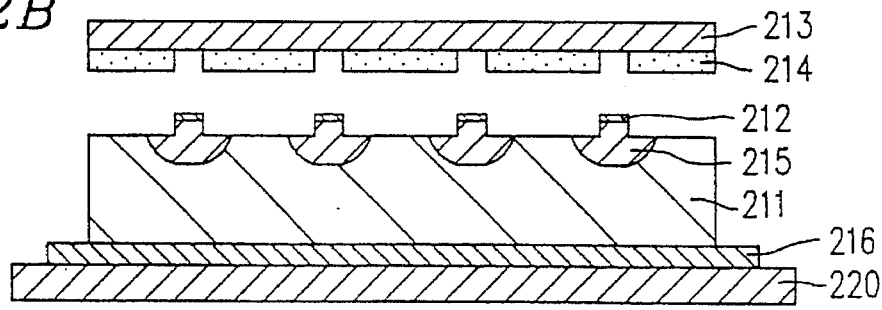

A conductive release layer 212, a mask layer 214, and a conductive pattern 215 are formed on a stainless steel base plate 213 in the same manner as is shown in FIGS. 11A through 11F. In the same manner as is shown in FIGS. 11G and 11H, the conductive release layer 212 and the conductive pattern 215 are transferred onto the lamination body 211 (FIG. 12B). In this manner, a first conductive layer is obtained.

Figure 12C:
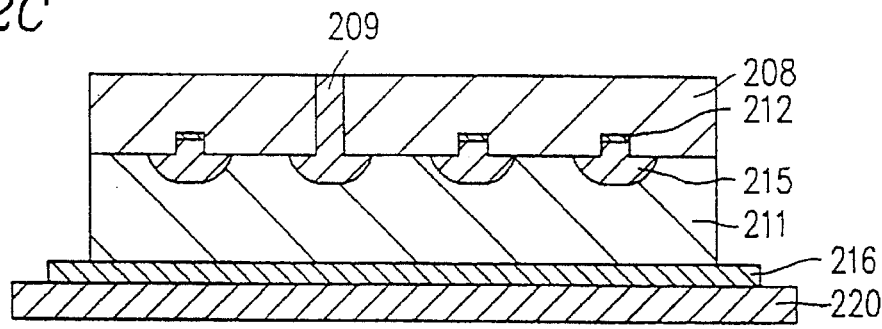

As is shown in FIG. 12C, an intermediate layer for electrically connecting the first conductive layer and a second conductive layer to be formed later is formed on the first conductive layer. The intermediate layer includes a magnetic greensheet 208 having a through-hole 209 filled with an Ag paste. The intermediate layer is laminated on the first conductive layer after being positioned so that the first conductive layer and the second conductive layer will be electrically connected to each other. The lamination of the intermediate layer is performed, for example, by applying heat of 90° C. and a pressure of 80 kg/cm$^2$ for approximately 2 seconds.

The intermediate layer is formed, for example, as follows.

The magnetic greensheet 208 having a thickness of about 100 μm obtained in the same manner as in the first example is punched to mechanically make the through-hole 209 having a diameter of 0.15 mm. The Ag paste is formed in the through-hole 209 by screen printing. The paste can be formed of any appropriate conductive material instead of Ag. The through-hole 209 can be of any shape, for example, circular, rectangular, polygonal or square.

Figure 12D:
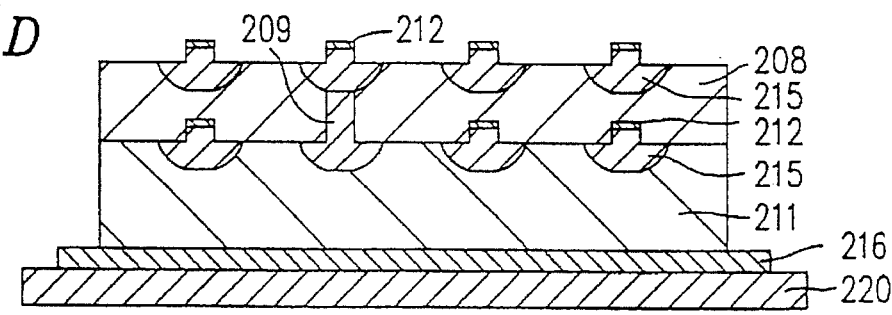
Figure 12E:
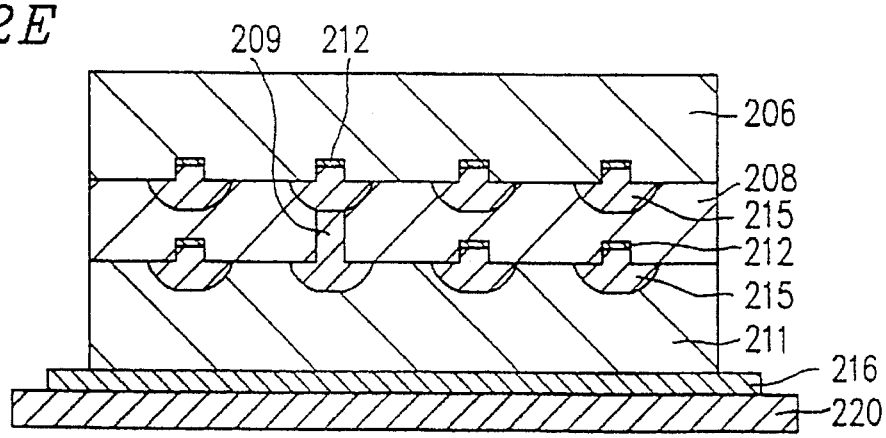
Figure 13A:
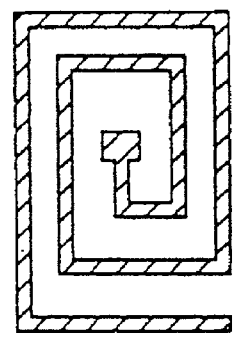
FIGS. 13A through 13D are views illustrating various conductive patterns applicable to the present invention.
Figure 13B:
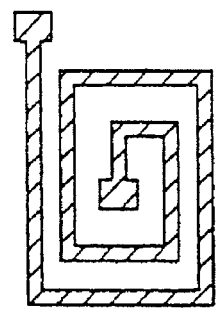
Figure 13C:
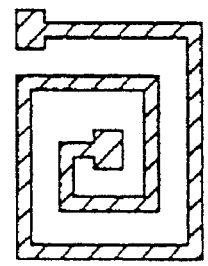
Figure 13D:
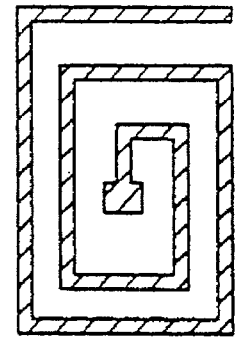

As is shown in FIG. 12D, the second conductive layer is formed on the intermediate layer in the same manner as the first conductive layer. By laminating at least one additional intermediate layer and at least one additional second conductive layer repeatedly, a greensheet lamination body having a desired number of conductive patterns can be formed.

After a desired number of conductive patterns are laminated, an insulation greensheet lamination 206 is formed on the second conductive layer at the top. A plurality of greensheets can be laminated to form the insulation greensheet lamination 206 before being laminated on the second conductive layer, or a plurality of greensheets can be laminated on the second conductive layer one after another. As necessary, heat and a pressure can be applied to the resultant lamination body (for example, 100 to 500 kg/cm$^2$, 30° C, 1 minute).

Thereafter, a lamination ceramic chip inductor is produced in the same manner as in the first example.

By the production method in this example, a ceramic chip inductor including a plurality of conductive patterns can be produced relatively easily. Accordingly, a ceramic chip inductor having a sufficiently low resistance and a sufficiently large inductance can be produced efficiently.

For example, in the case where four conductive patterns (A), (B), (C) and (D) shown in FIG. 13 are laminated with intermediate layers interposed therebetween, a conductive coil having approximately 9 turns can be produced. By combining the conductive patterns (A) and (D), a conductive coil having 5 turns can be produced. Combining the conductive patterns (A), (B), (C), (B), (C) and (D) results in a conductive coil having approximately 13 turns; and combining the conductive patterns (A), (B), (C), (B), (C), (B), (C) and (D) results in a conductive coil having approximately 17 turns.

Table 5 shows characteristics of a ceramic chip inductor having a size of 1.6 mm×0.8 mm formed by the method in this example. As is appreciated from Table 5, a ceramic chip inductor having a sufficiently low resistance and a sufficiently high impedance can be produced efficiently by the method of this example.

TABLE 5

| Number of conductive patterns | Number of turns | Impedance (100 MHz) | DC resistance |
| --- | --- | --- | --- |
| 2 | 5 | 600 ohms | 0.3 ohms |
| 4 | 9 | 1,000 ohms | 0.5 ohms |
| 6 | 13 | 1,500 ohms | 0.7 ohms |
| 8 | 17 | 2,000 ohms | 0.9 ohms |

In the first through fourth examples, the conductive patterns are formed of Ag. Any material which As available for electroforming such as Ni, Cu, Pd, Pt, Au, Cr, or an alloy thereof can be used for the conductive patterns. Instead of a magnetic greensheet, any kinds of insulation greensheets can be used.

As has been described, by a method for producing a conductive pattern according to the present invention, a fine conductive pattern having a sufficient thickness can be transferred onto a greensheet.

According to the present invention, the conductive pattern is formed on the exposed area of a conductive base plate defined by a mask layer formed on the conductive base plate. That is, the conductive pattern is formed in an concave portion in a mask layer which has enough adhesive strength to the conductive base plate. Accordingly, although the adhesive strength between the conductive pattern and the conductive base plate or the release layer, the friction at the interface between the conductive pattern and the mask layer hold the conductive pattern sufficiently .strong. Therefore, in the case where a conductive pattern having a narrow line width (for example, from about 30 to about 60 µm) is formed according to the present invention, the conductive pattern may not be delaminated from the conductive base plate by a flow of plating liquid in an electroplating step or a flow of water in a washing step. Moreover, in the case where the conductive pattern projecting from the mask layer is used as Example 4, the projecting portion of the conductive pattern is buried in a support layer such as an insulation greensheet, the transfer characteristic of the conductive pattern may be further enhanced.

Using such a method for transferring a conductive pattern onto a greensheet, a lamination ceramic chip inductor including a fine conductive pattern having a sufficient thickness (namely, a sufficiently low resistance) and thus having a sufficient high inductance (impedance) can be produced by laminating a small number of greensheets.

The thickness of the conductive patterns can be controlled to be in the range from submicrons to several tens of microns by using an appropriate thickness of photoresist or appropriate plating conditions. The Thickness of the conductive patterns can be even several millimeters by Using appropriate conditions.

In contrast to a conductor coil formed of thick film conductive patterns formed by printing and requiring the binder to be removed, the conductor coil produced by electroforming according to the present invention scarcely shrinks from sintering and thus is surrounded by the sintered magnetic body with a high density. The conductive patterns are scarcely delaminated from the magnetic greensheets.

In the case where the conductive pattern is transferred onto the support layer while the mask layer is maintained on the base plate, the base plate having the mask layer can be used repeatedly, which reduces the production cost.

Various other modifications-will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A method for producing a conductive pattern, comprising the steps of:

forming a mask layer on a conductive base plate, the mask layer having a pattern defining an exposed area of the conductive base plate;

forming a conductive release layer on the exposed area of the conductive base plate;

forming a conductive pattern on the conductive release layer in the exposed area of the conductive base plate by electroforming using a plating liquid which substantially maintains the pattern of the mask layer; and transferring the conductive pattern onto a support layer without removing the mask layer from the conductive base plate, wherein the conductive release layer and the conductive pattern are formed of identical materials.

2. A method for producing a conductive pattern according to claim 1, further comprising the step of forming a groove in the exposed area of the conductive base plate by etching before the formation of the conductive pattern.

3. A method for producing a conductive pattern according to claim 1, wherein the step of forming the mask layer includes the steps of:

forming a photoresist on the conductive base plate; and irradiating the photoresist with light for development to form the mask layer of the photoresist.

4. A method for producing a conductive pattern according to claim 1, wherein the step of forming the mask layer includes the steps of:

forming a photoresist on the conductive base plate;

irradiating the photoresist with light for development to form an exposed area on the conductive base plate;

forming an insulation layer on the exposed area; and removing the photoresist to form the mask layer of the insulation layer.

5. A method for producing a conductive pattern according to claim 1, wherein the step of forming the mask layer includes the steps of:

forming an insulation layer on the conductive base plate; and irradiating the photoresist with an excimer laser to form the mask layer of the insulation layer.

6. A method for producing a conductive pattern according to claim 1, wherein the mask layer is releasable from the support layer.

7. A method for producing a conductive pattern according to claim 1, further comprising the step of forming a releasable layer on the mask layer prior to the transferring step, wherein the releasable layer is releasable from the support layer.

8. A method for producing a conductive pattern according to claim 1, wherein the step of forming the conductive pattern includes the step of forming the conductive body projecting from the mask layer.

9. A method for producing a conductive pattern according to claim 1, wherein in the step of forming the conductive pattern, a plating liquid having a pH of about 1 to about 7 and including no cyanide is used.

10. A method for producing a greensheet lamination body, comprising the steps of:

forming a mask layer on a conductive base plate, the mask layer having a pattern defining an exposed area of the conductive base plate;

forming a conductive pattern on the exposed area of the conductive base plate by electroforming using a plating liquid which substantially maintains the pattern of the mask layer; and transferring the conductive pattern onto a first insulation greensheet without removing the mask layer from the conductive base plate;

forming a second insulation greensheet on a surface of the first insulation greensheet having the conductive pattern transferred thereon, wherein the step of forming the conductive pattern includes a step for forming a conductive body projecting from the mask layer, and wherein the step of transferring the conductive pattern includes a step for burying the conductive body projecting from the mask layer in the first greensheet.

11. A method for producing a greensheet lamination body according to claim 10, wherein the conductive pattern is directly transferred onto the first insulation greensheet without removing the mask layer.

12. A method for producing a greensheet lamination body according to claim 10, wherein the method further includes the steps of:

forming an insulation paste so as to cover the mask layer and the conductive pattern and drying the insulation paste to form the first insulation greensheet; and transferring the conductive pattern onto the first insulation greensheet without removing the mask layer.

13. A method for producing a greensheet lamination body according to claim 10, further comprising the steps of:

forming a plurality of first insulation greensheets each having the conductive pattern; and laminating the first insulation greensheets while electrically connecting the conductive patterns.

14. A method for producing a greensheet lamination body according to claim 13, further comprising the step of interposing a third insulation greensheet having a through-hole between adjacent first insulation greensheets.

15. A method for producing a greensheet lamination body according to claim 13, further comprising the step of interposing a third insulation greensheet having a through-hole filled with a printed thick film conductor between adjacent first insulation greensheets.

16. A method for producing a greensheet lamination body according to claim 13, further comprising the step of interposing a third insulation greensheet having a through-hole filled with an electroformed conductor between adjacent first insulation greensheets.

17. A method for producing a greensheet lamination body according to claim 10, further comprising the steps of:

directly transferring the conductive pattern onto the first insulation greensheet without removing the mask layer;

laminating a third insulation greensheet on a surface of the first insulation greensheet, the surface having the conductive pattern transferred thereon;

directly transferring another conductive pattern onto the third insulation greensheet without removing the mask layer; and laminating a second insulation greensheet on a surface of the third insulation greensheet, the surface having the another conductive pattern transferred thereon.

18. A method for producing a greensheet lamination body according to claim 10, wherein the first insulation greensheet and the second insulation greensheet are formed of a magnetic material.

19. A method for producing a greensheet lamination body according to claim 10, wherein the step of burying the conductive body projecting from the mask layer in the first greensheet is performed by pressing the conductive pattern onto the first greensheet.

20. A method for producing a greensheet lamination body according to claim 10, wherein the conductive body is formed so as to project from the mask layer vertically and to extend laterally in one direction.

21. A method for producing a greensheet lamination body according to claim 19, wherein the conductive body is formed so that an amount of the conductive body extending laterally in one direction is approximately the same as an amount of the conductive body projecting from the mask layer.

* * * * *